United States Patent [19]

Hasegawa et al.

[11] Patent Number: 4,910,157

[45] Date of Patent: Mar. 20, 1990

[54] METHOD OF PRODUCING RECESSED GATE OF MESFET IN COMPOUND SEMICONDUCTOR

[75] Inventors: Yuuichi Hasegawa, Kawasaki; Hidetake Suzuki, Tokyo, both of Japan

[73] Assignee: Fujitsu Limited, Kawasaki, Japan

[21] Appl. No.: 397,886

[22] Filed: Aug. 23, 1989

[30] Foreign Application Priority Data

Aug. 26, 1988 [JP] Japan .................................. 63-213319

[51] Int. Cl.⁴ .................. H01L 21/265; H01L 29/56; H01L 29/80
[52] U.S. Cl. ........................................ 437/22; 437/39; 437/203; 437/912
[58] Field of Search ................... 437/22, 39, 176, 203, 437/912; 357/15, 22

[56] References Cited

U.S. PATENT DOCUMENTS

| 4,173,063 | 11/1979 | Kniepkamp et al. | 357/22 |
| 4,312,112 | 1/1982 | Calviello | 437/912 |
| 4,713,354 | 12/1987 | Egawa et al. | 437/22 |

FOREIGN PATENT DOCUMENTS

| 62-28592 | 6/1987 | Japan | 437/912 |
| 63-283029 | 11/1988 | Japan | 437/912 |

Primary Examiner—Olik Chaudhuri
Attorney, Agent, or Firm—Staas & Halsey

[57] ABSTRACT

A method of producing a compound semiconductor device comprises the steps of: forming a recess portion on a compound semiconductor substrate; forming an ion penetrating mask on the recess portion in such a manner that the surfaces of the compound semiconductor substrate and the ion penetrating mask are level; forming an active layer having a substantially uniform depth is the compound semiconductor by implanting impurity ions into the entire exposed surface and, removing the ion penetrating mask and forming a gate electrode at the recess portion.

8 Claims, 6 Drawing Sheets

METHOD OF PRODUCING RECESSED GATE OF MESFET IN COMPOUND SEMICONDUCTOR

BACKGROUND OF THE INVENTION

1. Field of the Invention

The present invention relates to a method of producing a compound semiconductor device, more particularly to a method of producing a MESFET (Metal Semiconductor FET) of, for example, GaAs, and having a recess portion.

2. Description of the Related Art

A GaAs MESFET is widely used in the fields of satellite communication and ground micro-wave communication, etc.

FIGS. 1A to 1E are cross-sectional step views explaining a conventional method of producing a GaAs MESFET having a recessed portion.

As shown in FIG. 1A, a resist film mask 2 is selectively formed on a semi-insulating (SI−) GaAs substrate 1, and after patterning with mask 2, silicon ions (Si+) are implanted into the exposed portions of the substrate 1 to form an n-GaAs active layer 3 having a uniform depth.

Then, as shown in FIG. 1B, the patterned resist film mask 2 is removed, a resist film mask 4 is formed over the n-GaAs active layer 3 portion or other portions, and silicon ions are implanted in exposed portions at both sides to form an n+-GaAs contact layer.

As shown in FIG. 1C, after removing the resist film mask 4 and applying a heat treatment to activate the ion-implanted portions, a silicon dioxide ($SiO_2$) film 6 is formed on the n+GaAs contact layer 5, except for portions thereof on which source and drain electrodes 7 of AuGe/Ni/Au are formed.

Then, as shown in FIG. 1D, a third resist film mask 8 having an opening is formed on the n+GaAs contact layer 5 and the source and drain electrodes 7, and the $SiO_2$ film 6 covering a recess formation portion is etched by a hydrogen fluoride type solution, which etching is continued until a recess portion 9 is formed.

Then, as shown in FIG. 1E a gate electrode 10 of Al is formed is formed by evaporating aluminum (Al) from above the resist film mask 8, and then removing the resist film mask 8 together with unwanted Al by a lift-off process.

The recess portion 9 is provided to enable a thinning of the n GaAs active layer having a low resistivity by etching, to obtain a desired current value, thereby to separate the gate electrode from a position in which a surface potential exists, and disperse the electric field concentration to obtain a high breakdown voltage.

Nevertheless as explained above, when the recess portion is formed by a wet etching process, since the etching is carried out through a gate window having a thickness of 1 μm or less, the etching quantity is not constant and is deviated, and the deviation of a saturated current, for example, a drain current ($Id_{ss}$), becomes large.

Accordingly, the present inventors investigated other processes involving the step of preforming a recess portion.

FIGS. 2A and 2B are cross-sectional step views of one such process.

This process comprises the steps of forming a recess portion 19 on a GaAs substrate 11 and forming an n GaAs active layer 13 by an ion-implanting process, as shown in FIG. 2A. A GaAs MESFET then can be realized by forming an n+GaAs contact layer 15, $SiO_2$ layer 16, source and drain electrodes 17, and a gate electrode 20, as shown in FIG. 2B, by using the aforementioned conventional processes.

This method of producing the GaAs MESFET is advantageous in that an improvement of the breakdown voltage due to the recess structure and deviation of the saturated current can be reduced but when the gate voltage approaches a pinch-off voltage, the mutual conductance (Gm) is compressed and it is difficult to realize a high power and high efficiency operation. The compression of the Gm means that Gm becomes small at a low current area and the gain is reduced.

SUMMARY OF THE INVENTION

An object of the present invention is to provide a method of producing a compound semiconductor device, wherein deviation of the saturated current is reduced and a mutual conductance (Gm) close to the pinch-off voltage is improved. Therefore, according to the present invention, there is provided a method of producing compound semiconductor device comprising the steps of: forming a recess portion on a compound semiconductor substrate; forming an ion penetrating mask on the recess portion in such a manner that the surfaces of the compound semiconductor substrate and the ion penetrating mask are levelled; forming an active layer having a substantially uniform depth in the compound semiconductor by implanting impurity ions into the entire exposed surface thereof; removing the ion penetrating mask and forming a gate electrode at the recess portion.

In the present invention, preferably a semi-insulating material, e.g., GaAs, InP, etc. is used as the compound semiconductor substrate.

Further according to the present invention, preferably silicon nitride (SiN) and silicon mono-oxide, etc., are used as the ion penetrating mask.

Moreover according to the present invention, preferably Si ions, S ions, Se ions etc., are used as the impurity ions to be implanted into the semiconductor substrate.

DESCRIPTION OF THE PREFERRED EMBODIMENTS

Before describing the preferred embodiments the principle of the main processes of the present invention will be explained with reference to FIGS. 3A and 3B.

Figure 1A:
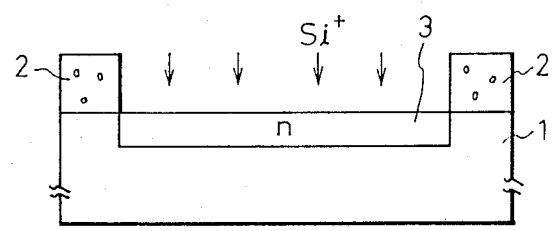
FIGS. 1A to 1E are cross-sectional step views explaining a conventional method of producing a GaAs FET having a recess portion.
Figure 1B:
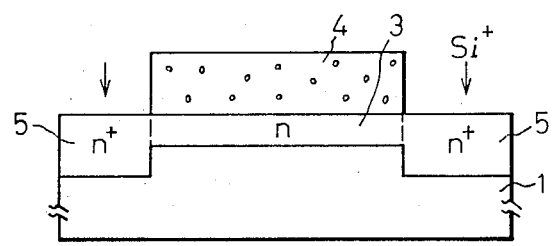
Figure 1C:
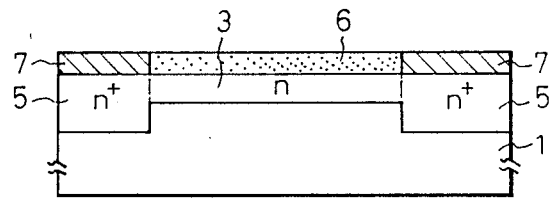
Figure 1D:
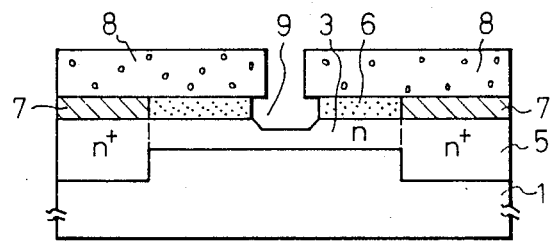
Figure 1E:
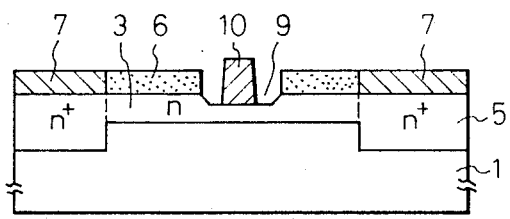
Figure 2A:
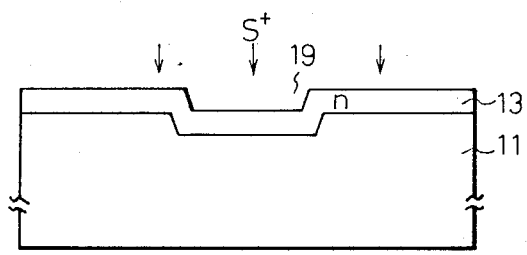
FIGS. 2A and 2B are cross-sectional step views of a process.
Figure 2B:
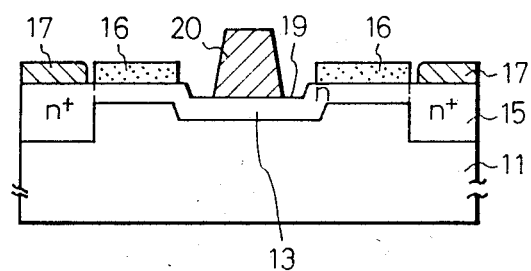
Figure 3A:
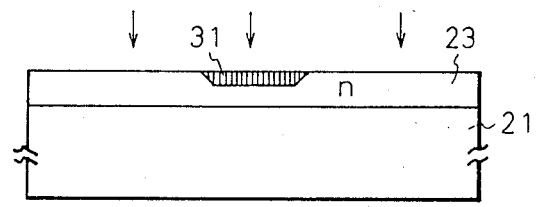
FIGS. 3A and 3B are cross-sectional step views explaining the principle of the main process of the present invention.
Figure 3B:
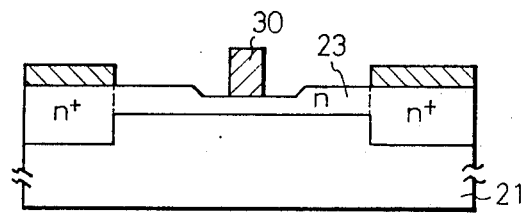

As shown in FIGS. 3A and 3B, a recess portion 29 is formed on a compound semiconductor substrate 21, and an ion penetrating mask 31 is formed thereon so that the surface of the mask 31 is level with that of the substrate 21. Then, impurity ions are implanted into the surfaces thereof so that an active layer 23 having an uniform depth is formed. Thereafter, the ion penetrating mask 31 is removed and a gate electrode 30 is formed on a part of the recess portion 29.

According to the present invention, as explained above, the recess is preformed on the compound semiconductor substrate and the mask for forming the recess is not a gate window having a submicron size, as used in the prior art, but a mask having a large opening portion.

Thus, there is little deviation of the shape of the recess, and a good reproducibility is obtained.

The recess is filled with an ion penetrating mask so that the exposed surface is level, and the ion penetrating mask is formed of a material having the same permeability as the compound semiconductor substrate, by implanting ions. Thus, when impurity ions are implanted into the substrate, an active layer having a uniform depth is formed in the substrate having the recess portion therein.

Also, according to the present invention, since the recess portion is preformed, the combination of the shape of recess, the channel concentration and the depth can be changed by changing the ion implanting conditions in accordance with the recess portion.

A preferred embodiment of the present invention is now explained with reference to FIGS. 4A to 4M.

Figure 4A:
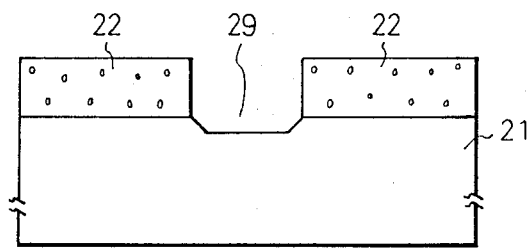
FIGS. 4A to 4M are cross-sectional step views explaining an embodiment of the present invention.
Figure 4B:
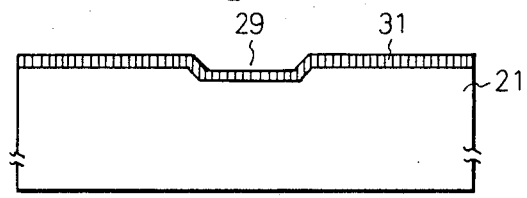

As shown in FIG. 4A, a resist film mask 22 wherein an opening for a recess, having a width of 1 to 2 $\mu$m, preferably 1.5 $\mu$m, is provided is formed on a semi-insulating GaAs substrate 21 having a resistance of $5 \times 10^8$ cm, and a wet etching is carried out by using a mixed solution of HF, $H_2O_2$ and $H_2O$ so that a recess portion 29 having a depth of 0.10 to 0.20 $\mu$m, preferably 0.15 $\mu$m is formed.

Thereafter, the resist film mask 22 is removed by a usual solvent and a silicon nitride (SiN) film 31, which acts as a ion penetrating mask, is formed on the exposed surfaces of the GaAs substrate 21 and the recess portion 29 by a plasma CVD process, whereby the recess portion 29 is filled with the SiN film 31.

Figure 4C:
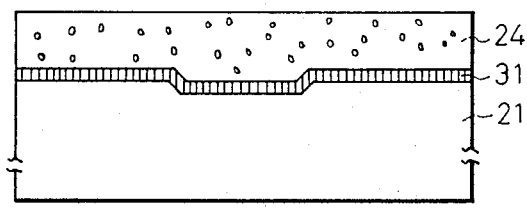
Figure 4D:
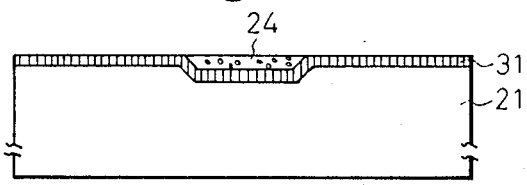

Then, as shown in FIG. 4c, a resist film 24 is formed on the exposed surface of the SiN film 31, by a spin-coating process and $O_2$ plasma ashing is carried out so that only the recess portion of the SiN film 24 remains, as shown in FIG. 4D.

Figure 4E:
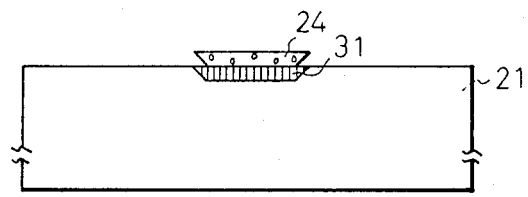

Then, as shown in FIG. 4E, an exposed SiN film 31 is etched by a plasma dry etching process using an $SF_6$ gas, so that an SiN film 31 covering only the recess portion 29 is obtained.

Figure 4F:
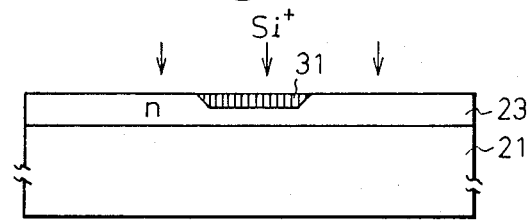

Thereafter, as shown in FIG. 4E and 4F, the resist film mask 24 is removed by $O_2$ ashing so that a flat surface substrate in which the recess portion is filled with the SiN film 31 is obtained.

Then, as shown in FIG. 4F, silicon ions are implanted into the exposed surface to a dosage of $5 \times 10^{12}/cm^3$ and an implanting energy of about 75 KeV to form an n GaAs active layer 23. Since the SiN film 31 has the same ion permeability as the GaAs substrate 21, an active layer 23 having a uniform depth, for example, 0.3 $\mu$m, is obtained.

Figure 4G:
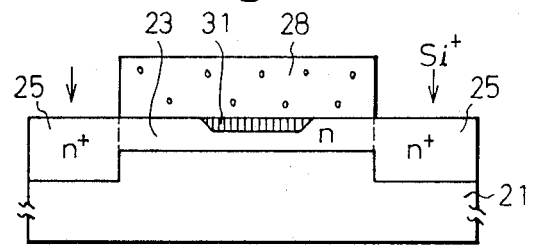

Then, as shown in FIG. 4G, a patterned resist film mask 28 covering the recess portion 29 is formed, and silicon ions are again implanted into the n GaAs active layer to a dosage of $5 \times 10^{12}/cm^3$ and an implanting energy of 200 KeV to form a n+GaAs contact layer 25 having a depth of 0.35 $\mu$m.

Figure 4H:
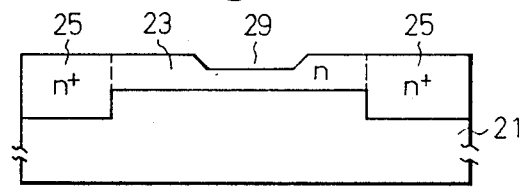

Then, as shown in FIG. 4H the resist film mask 28 is removed by $O_2$ ashing, a heat treatment is carried out at a temperature of 850° C., for 30 minutes in an atmosphere of arsenic (As), to define the abovementioned active layer 23 and the contact layer 25, and thereafter, the SiN film 31 on the recess portion 29 is removed.

Figure 4I:
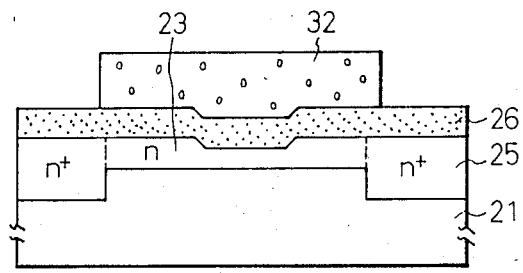
Figure 4J:
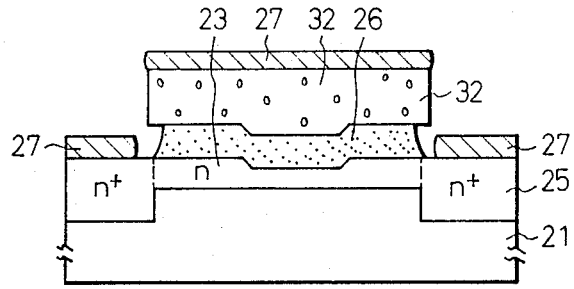

Then, as shown in FIG. 4I, an $SiO_2$ film 26 having a thickness of about 5000 Å is formed on the exposed surface of the n+GaAs contact layer 25 and n GaAs active layer 23 by a well known CVD process, and a resist film mask 32 is deposited on the $SiO_2$ film 26 substantially above the n GaAs active layer.

Thereafter, using the resist film mask 32, the $SiO_2$ film 26 is wet-etched so that windows for forming electrodes are opened to expose the n+GaAs contact layer 25. Then, as shown also in FIG. 4J, an AuGe/Ni/Au layered film 27 having thicknesses of 400 Å, 100 Å and 4000 Å for the respective layers is formed by a well known vapour deposition process.

Figure 4K:
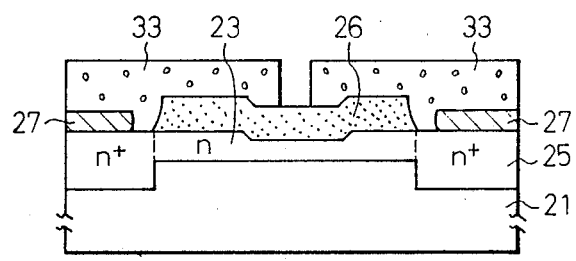

Then, as shown in FIG. 4K, the resist film mask 32 and the AuGe/Ni/Au film 27 thereon is lifted off to form source- and drain electrodes. Then, a resist film 33 mask is formed on the exposed source and only a gate electrode formation portion is left open.

Figure 4L:
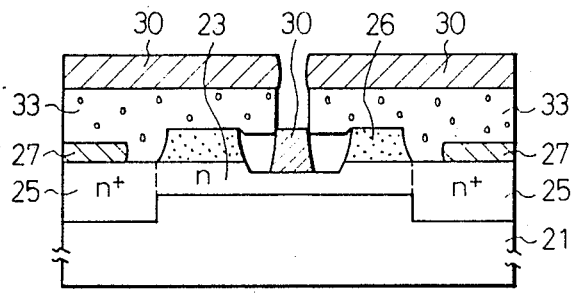

Thereafter, as shown in FIG. 4L, the $SiO_2$ film 26 is wet etched by HF, etc., using the resist film mask 33 as a protective coat, so that a gate electrode formation portion is formed while a recess portion of the n+GaAs active layer 25 is exposed by additional etching. Then, an aluminum (Al) film 30 having a thickness of about 7000 Å is vapor deposited from above the resist film mask 33.

Figure 4M:
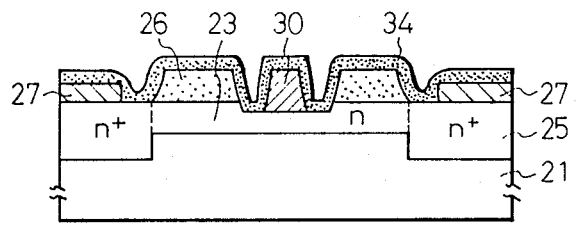

Finally, as shown in FIG. 4M, the resist film mask 33 and the Al film 30 thereon are lifted off, whereby an Al gate electrode 30 is formed. In addition, a passivation film 34 of, for example, SiN, and having a thickness of 1000 Å is formed by a well known plasma CVD process, and thus a GaAs MESFET is realized.

In the above example, the SiN film was used as the ion penetrating film, but an $SiO_2$ film, for example, can be also used.

We claim:

1. A method of producing a compound semiconductor device comprising the steps of:
   forming a recess portion on a compound semiconductor substrate;
   forming an ion penetrating mask on the recess portion in such a manner that the surfaces of the compound semiconductor substrate and the ion penetrating mask are level;
   forming an active layer having a substantially uniform depth in the compound semiconductor by implanting impurity loss to the exposed surfaces; and
   removing said ion penetrating mask and forming a gate electrode at said recess portion.

2. A method according to claim 1, wherein said compound semiconductor is selected from the group consisting of gallium arsenide and InP.

3. A method according to claim 1, wherein said ion penetrating mask has substantially the same ion permeability as said compound semiconductor substrate.

4. A method according to claim 3, wherein said ion penetrating mask is selected from the group consisting of silicon nitride and silicon dioxide.

5. A method according to claim 1, wherein the width and the depth of said recess portion are 1 to 2 $\mu$m and 0.1 to 0.2 $\mu$m, respectively.

6. A method according to claim 5, wherein the width and the depth of said recess portion are 1.5 $\mu$m and 0.15 $\mu$m, respectively.

7. A method according to claim 1, wherein said impurity ions are selected from the group consisting of Si ions, S ions and Se ions.

8. A method according to claim 1, wherein said compound semiconductor device is selected from the group consisting of GaAs MESFET and InP MESFET.

* * * * *

UNITED STATES PATENT AND TRADEMARK OFFICE
CERTIFICATE OF CORRECTION

PATENT NO. : 4,910,157
DATED : March 20, 1990
INVENTOR(S) : YUUICHI HASAGAWA ET AL.

It is certified that error appears in the above-identified patent and that said Letters Patent is hereby corrected as shown below:

Col. 1, line 43, delete "is formed" (first occurrence).

Col. 2, line 23, after "producing" insert --a--.

Col. 3, line 26, delete "is provided";
       line 34, "a" should be --the--;
       line 47, "FIG." should be --FIGS.--.

Col. 4, line 44, "loss" should be --ions--.

Signed and Sealed this

Twenty-eighth Day of May, 1991

Attest:

HARRY F. MANBECK, JR.

Attesting Officer

Commissioner of Patents and Trademarks